United States Patent
Park (10) Patent No.: US 8,136,006 B2
(45) Date of Patent: Mar. 13, 2012

(54) TURBO DECODING APPARATUS AND METHOD

(75) Inventor: Sook-Min Park, Seoul (KR)

(73) Assignee: Samsung Electronics Co., Ltd (KR)

( * ) Notice: Subject to any disclaimer, the term of this patent is extended or adjusted under 35 U.S.C. 154(b) by 803 days.

(21) Appl. No.: 12/262,844

(22) Filed: Oct. 31, 2008

(65) Prior Publication Data

US 2009/0217127 A1    Aug. 27, 2009

(30) Foreign Application Priority Data

Feb. 23, 2008    (KR) ........................ 10-2008-0016550

(51) Int. Cl.
*H03M 13/00*    (2006.01)

(52) U.S. Cl. ....................................................... 714/752

(58) Field of Classification Search .......... 714/752–755, 714/758, 759, 781–795
See application file for complete search history.

(56) References Cited

U.S. PATENT DOCUMENTS

| | | | |
|---|---|---|---|
| 6,982,659 B2 * | 1/2006 | Shen et al. ...................... | 341/50 |
| 7,236,591 B2 * | 6/2007 | Sim ................................. | 380/33 |
| 7,549,113 B2 * | 6/2009 | Lin ................................. | 714/794 |
| 2002/0174401 A1 * | 11/2002 | Wang et al. .................... | 714/786 |
| 2003/0028843 A1 * | 2/2003 | Chang et al. ................... | 714/786 |
| 2004/0140915 A1 * | 7/2004 | Shen et al. ....................... | 341/50 |
| 2005/0172204 A1 * | 8/2005 | Lin ................................. | 714/755 |

* cited by examiner

*Primary Examiner* — Nadeem Iqbal
(74) *Attorney, Agent, or Firm* — The Farrell Law Firm, P.C.

(57) ABSTRACT

A turbo decoding method and apparatus for performing iterative decoding on a received signal is provided. A decoder receives a signal and an $(N-1)^{th}$ decoding result, performs $N^{th}$ decoding thereon, and outputs first extrinsic information. A transformer reduces a bit width of the first extrinsic information output from the decoder and outputs second extrinsic information. A memory stores the second extrinsic information output from the transformer. A de-transformer de-transforms the second extrinsic information stored in the memory, to third extrinsic information having a same bit width as that of the first extrinsic information, and inputs the third extrinsic information to the decoder.

8 Claims, 11 Drawing Sheets

TURBO DECODING APPARATUS AND METHOD

PRIORITY

This application claims priority under 35 U.S.C. §119(a) to a Korean Patent Application filed in the Korean Intellectual Property Office on Feb. 23, 2008 and assigned Serial No. 2008-16550, the entire disclosure of which is incorporated herein by reference.

BACKGROUND OF THE INVENTION

1. Field of the Invention

The present invention relates generally to a decoding apparatus and method, and in particular, to a turbo decoding apparatus and method.

2. Description of the Related Art

As communication systems develop and mobile communication is popularized, there is an increasing demand for minimizing errors that occur in a communication process. Accordingly, researchers studying channel codes have attempted to find codes having performance approaching Shannon's limit. To date, different high-performance codes, such as turbo codes, have been proposed, which are generated by highly complex coding rules, but there is still difficulty in providing a low-complexity decoder capable of effectively decoding these codes.

Figure 1:
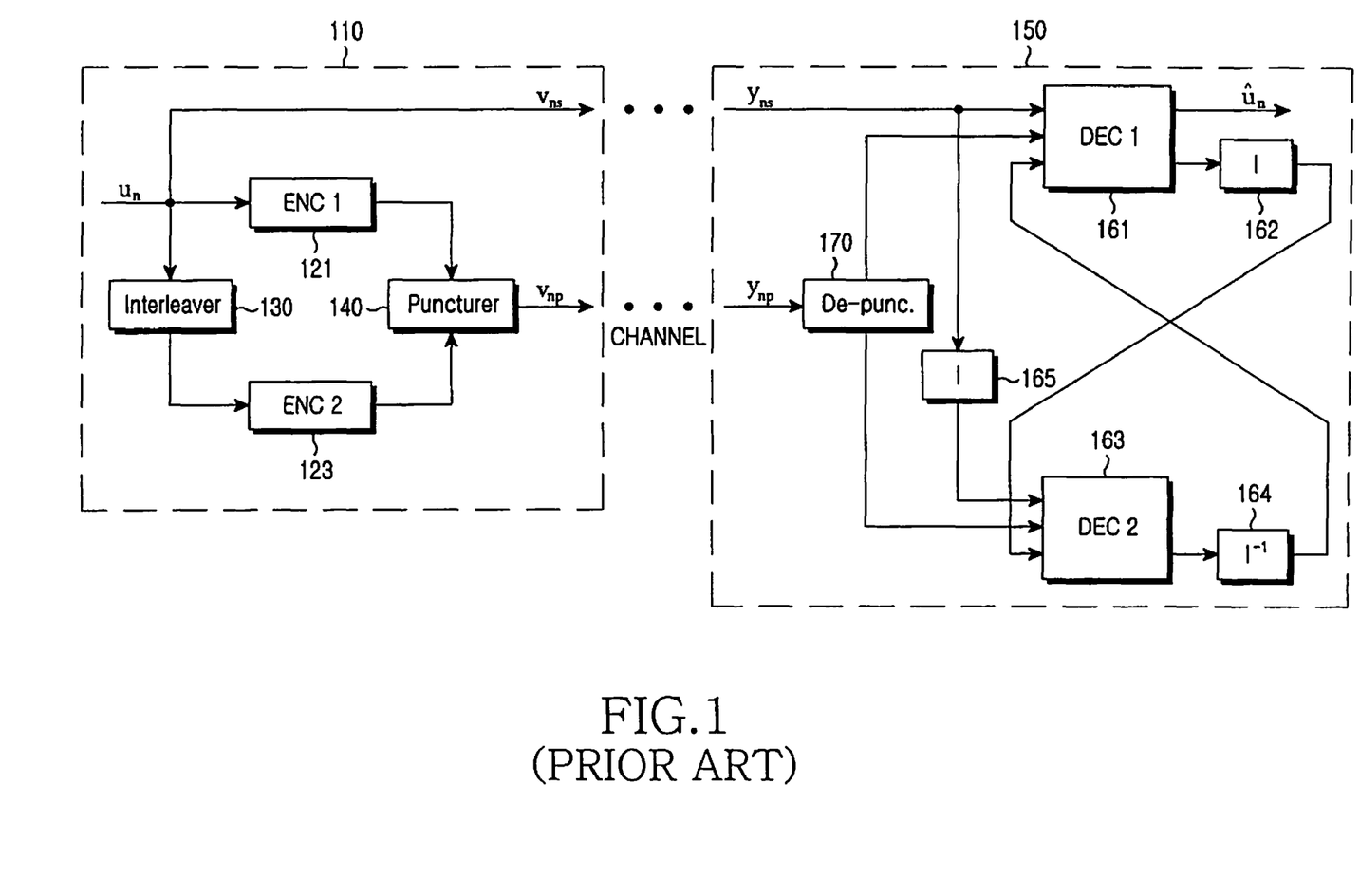
FIG. 1 is a block diagram illustrating a conventional encoder and decoder using turbo codes.

A conventional encoding apparatus and a decoding apparatus that use the normal turbo codes (or Binary Turbo Codes) are illustrated in FIG. 1.

Referring to FIG. 1, generally, a turbo coding apparatus 110 includes two encoders 121 and 123, a puncturer 140, and an interleaver 130 for connecting the encoders 121 and 123. The turbo coding apparatus 110 receives an input information bit stream $u_n$ and outputs one output bit stream $v_{ns}$. In addition, the turbo coding apparatus 110 inputs the input information bit stream $u_n$ to the first encoder (ENC 1) 121, and obtains a first parity bit stream. The input information bit stream $u_n$ is input to the interleaver 130 having the same size as a length of the input information bit stream $u_n$, and interleaved according to a predetermined pattern. The interleaved input information bit stream is input to the second encoder (ENC 2) 123 where a second parity bit is obtained. The output of the turbo coding apparatus 110 has dual-parity information due to the output of the first encoder 121 and also due to the output modified by the interleaver 130. The outputs can undergo puncturing by the puncturer 140 to obtain a code rate desired by the turbo coder. For example, in order to set the code rate to ½, the puncturer 140 can perform puncturing so that the outputs from the two encoders are alternately output. The parity bit $v_{np}$ finally obtained through the puncturing is transmitted through a transmission channel with the output bit stream $v_{ns}$.

The coding method for the turbo codes is called "a coding method for parallel concatenated codes," because the two encoders are applied to a set of the same input sequences though they are different in arrangement.

A codeword coded by the turbo coding apparatus 110 is subjected to decoding by a decoding apparatus 150 for turbo codes. Generally, the decoding apparatus 150 uses a Soft Input Soft Output (SISO) decoder that uses a Maximum A Posteriori (MAP) algorithm to generate information on each bit. Further, to improve decoding performance, the decoding apparatus 150 uses iterative decoding (Iteration).

Referring again to FIG. 1, the decoding apparatus 150 for turbo codes includes two decoders (DEC 1 and DEC2) 161 and 163, interleavers 162, 164, and 165, and a de-puncturer 170. When information bits $y_{ns}$ and parity bits $y_{np}$ are defined as a signal that a codeword of the turbo coder has passed through a channel, $y_{ns}$ is a signal that the information bits have passed through the channel, and $y_{np}$ is a signal that the parity bits have passed through the channel. The decoders 161 and 163 each receive, as priori information, received signals $y_{ns}$ and $y_{np}$, and extrinsic bits, or information output in the previous decoding process, and generate Log likelihood Ratio (LLR) $L_e$ by performing decoding thereon.

Figure 2:
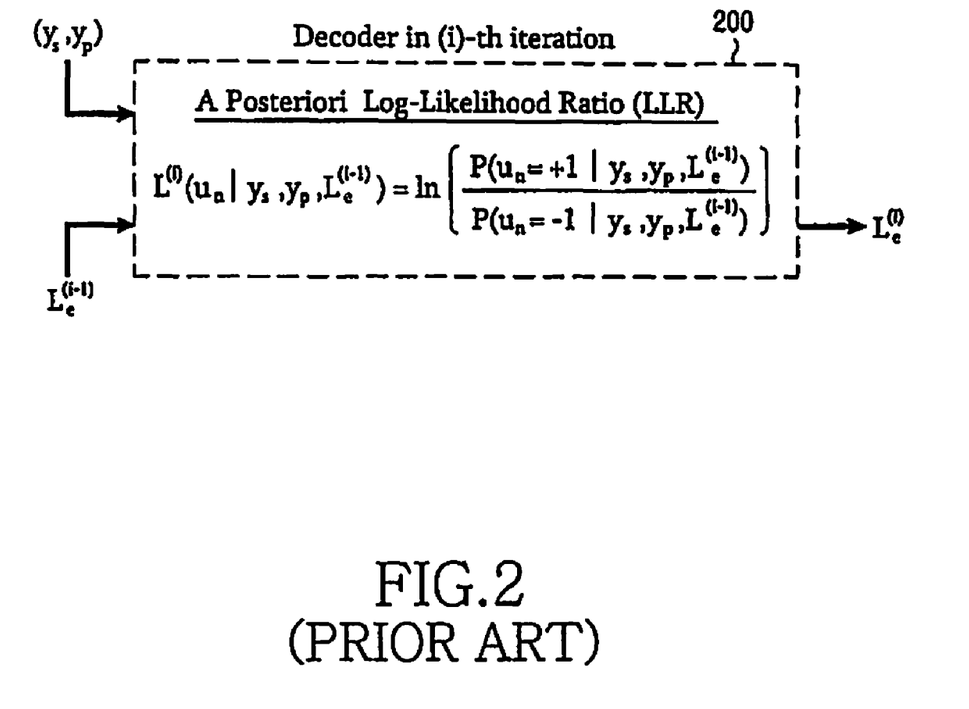
FIG. 2 is a diagram illustrating a MAP algorithm.

Extrinsic information included in the LLR improves decoding reliability, as it is priori information of the next decoding stage. This is called a "MAP algorithm". An example of the MAP algorithm is illustrated in FIG. 2, which will be described in more detail below. Commonly, the MAP algorithm performs 8-iteration decoding to decrease BER, thereby increasing decoding performance.

FIG. 2 illustrates a detailed structure of a decoder 200 in an $i^{th}$ iteration. Referring to FIG. 2, the decoder 200 receives information bits $y_s$, parity bits $y_p$, and extrinsic bits $L_e$, or an output value in an $(i-1)^{th}$ iteration, and generates an LLR for each bit.

Extrinsic information included in the LLR improves decoding reliability, as it is priori information of the next decoding stage in an $(i+1)^{th}$ iteration. Further, the extrinsic information should be stored in a memory for the next decoding.

Figure 3:
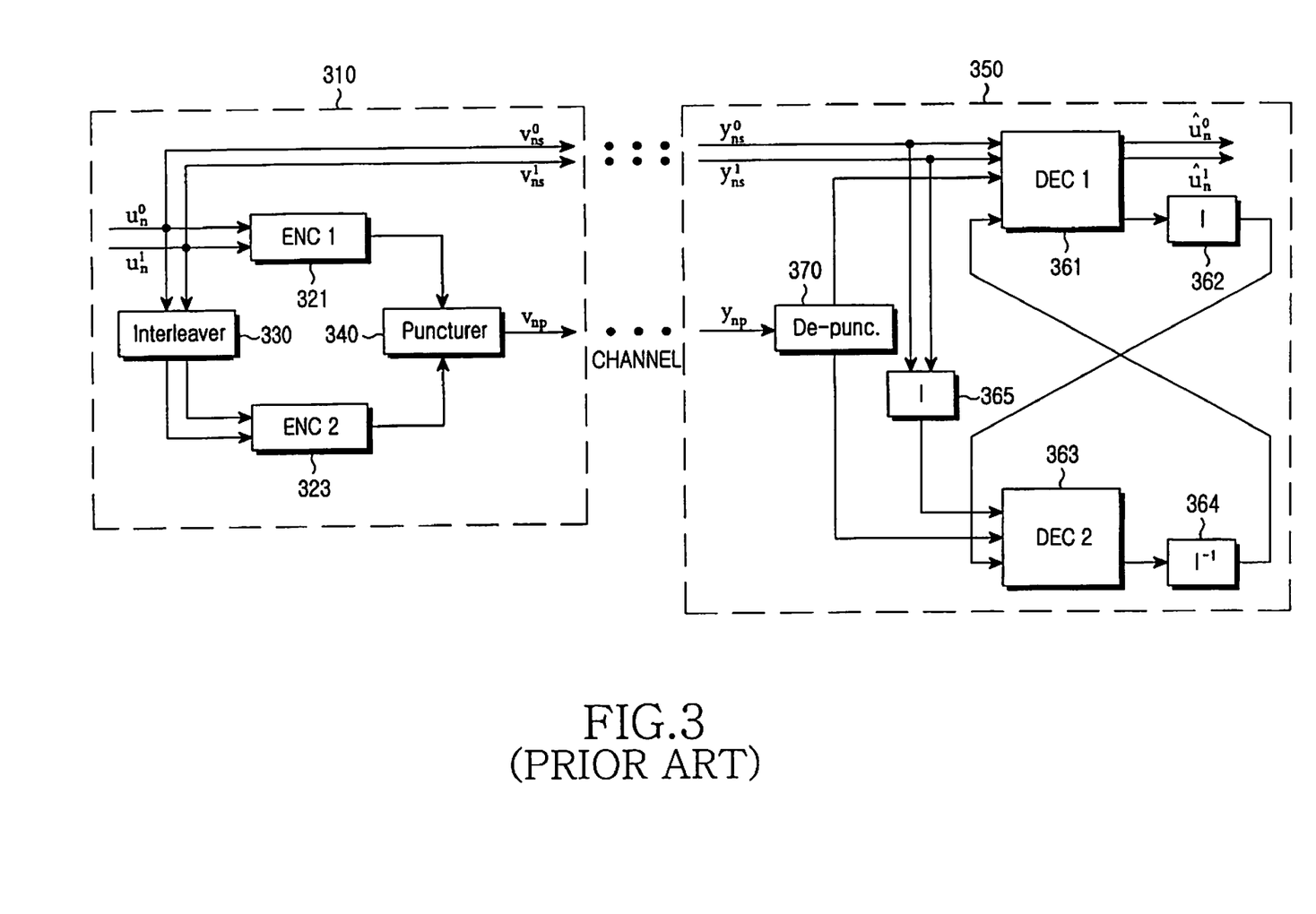
FIG. 3 is a diagram illustrating Non-Binary Turbo Codes.

FIG. 3 illustrates an encoding apparatus and a decoding apparatus for Non-Binary Turbo Codes. Referring to FIG. 3, the Non-Binary Turbo Codes are similar to the Binary Turbo Codes illustrated in FIG. 1 in that an encoder 310 includes two encoders 321 and 323, a puncturer 340, and an interleaver 330 connecting the two encoders 321 and 323, but are different in that the input codes are Binary Turbo Codes. Referring to FIG. 3, the Non-Binary Turbo Codes are different in that encoding is performed as in the Binary case but the number of encoder information symbols received at a time is expressed as $u_n = (u_n^0, u_n^1)$ of 2 bits.

Figure 4:
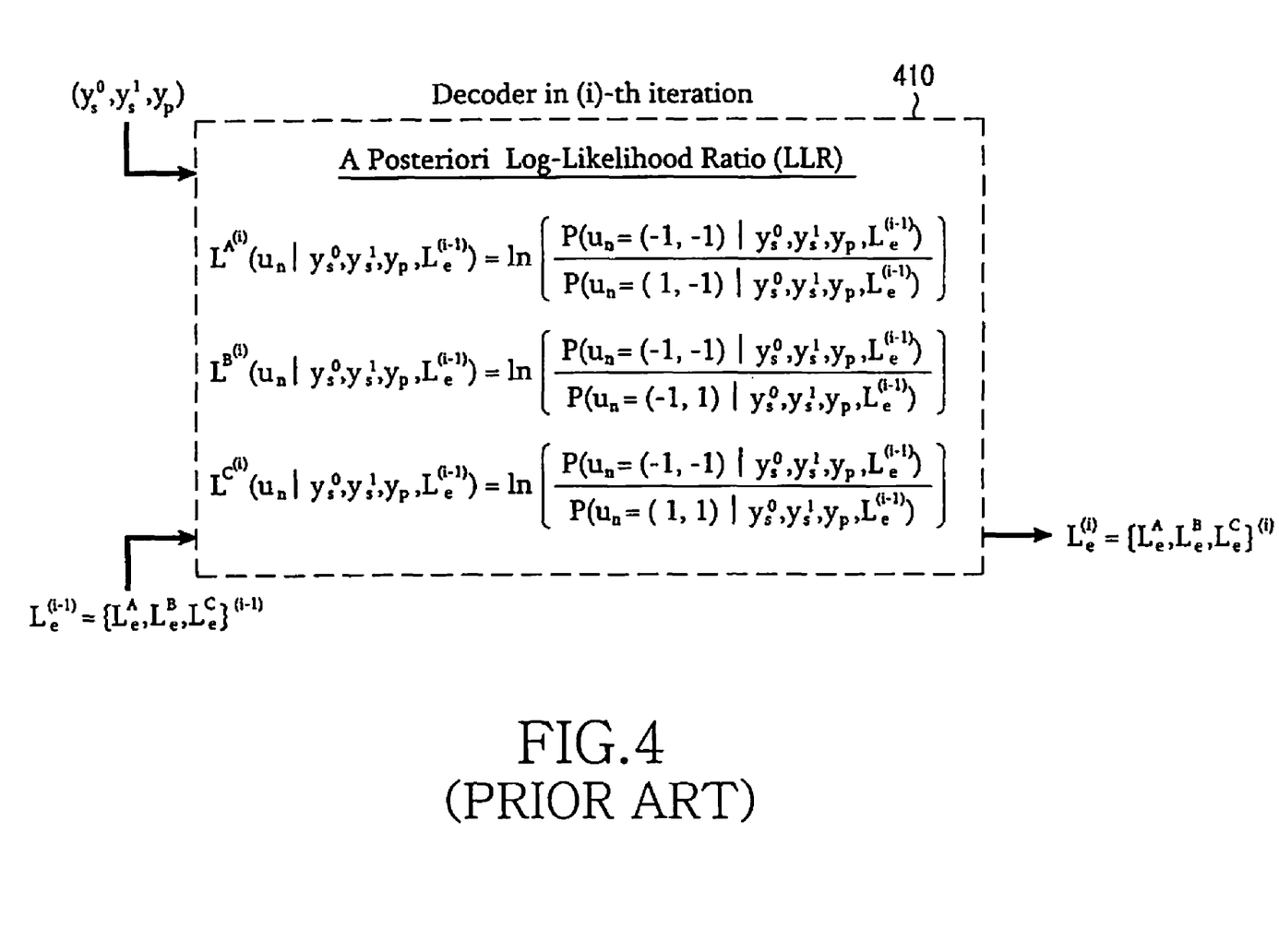
FIG. 4 is a diagram illustrating a MAP algorithm of Non-Binary Turbo Codes.

Similarly, referring to FIG. 4, which is a diagram illustrating an example of a MAP algorithm in Non-Binary Turbo Codes, information symbols $y_n = (y_{ns}^0, y_{ns}^1)$, parity symbols $y_{np}$, and extrinsic symbols $L_e = (L_e^A \ L_e^B \ L_e^C)$ needed in a decoder 410 are also input at a time.

As to the number of encoder input bits, because k bits, not 1 bit, are received as inputs, and decoding is performed in units of $2^k$-ary symbols, not in a bit-by-bit calculation. For example, for binary turbo codes with 2 simultaneous input bits (k=2), an LLR value is calculated with 4-ary symbols of (1,1), (1,-1), (-1,1), and (-1,-1). The LLR calculation is a probability ratio calculation, and because one of four combinations is regarded as a reference, a total of $(2^k-1)$ LLR values are needed, so 3 LLR values are needed for the above binary turbo codes.

Therefore, as $(2^k-1)$ extrinsic information values per k input bits are needed for non-binary decoding, the non-binary turbo codes are higher in terms of an extrinsic memory size than the binary turbo codes by $(2^k-1)/k$.

Binary turbo codes with k=2 are higher by 1.5 times in terms of the memory than the binary case.

Referring to Table 1, the memory for extrinsic information occupies 43% of a total decoder area.

TABLE 1

|  | Gate Counts | Area Percentage |
| --- | --- | --- |
| Decoder logic | 22,867 | 17% |
| Forward/Backward Metric Memory | 11,009 | 8% |
| Extrinsic Information Memory | 59,310 | 43% |
| Memory for Received Signal | 29,440 | 21% |
| Interleaver Memory | 15,013 | 11% |
| Total | 137,639 | 100% |

Because the memory for storing extrinsic information occupies a considerable part of the decoder, the size of the memory is very significant in determining the size of the decoder. Accordingly, there is a need to reduce a size of the memory.

SUMMARY OF THE INVENTION

The present invention has been designed to address at least the above-described problems and/or disadvantages of the prior art, and to provide at least the advantages described below. Accordingly, the present invention provides a low-memory decoding apparatus and method for reducing a storage memory by processing extrinsic information.

In accordance with an aspect of the present invention, a turbo decoding apparatus is provided for performing iterative decoding on a received signal. The turbo decoding apparatus includes a decoder for receiving a signal and an $(N-1)^{th}$ decoding result, performing $N^{th}$ decoding thereon, and outputting first extrinsic information; a transformer for reducing a bit width of the first extrinsic information output from the decoder and outputting second extrinsic information obtained; a memory for storing the second extrinsic information output from the transformer; and a de-transformer for de-transforming the second extrinsic information stored in the memory, to third extrinsic information having a same bit width as the first extrinsic information, and inputting the third extrinsic information to the decoder.

In accordance with another aspect of the present invention, a turbo decoding method is provided for performing iterative decoding on a received signal. The turbo decoding method includes receiving a signal and an $(N-1)^{th}$ decoding result; performing $N^{th}$ decoding on the received signal and the $(N-1)^{th}$ decoding result; generating first extrinsic information; transforming the first extrinsic information into second extrinsic information obtained by reducing a bit width of the first extrinsic information; storing the generated at least one second extrinsic information; and de-transforming the stored second extrinsic information into third extrinsic information having a same bit width as the first extrinsic information.

BRIEF DESCRIPTION OF THE DRAWINGS

The above and other aspects, features, and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail herein below with reference to the annexed drawings. In the following description, a detailed description of known functions and configurations incorporated herein has been omitted for clarity and conciseness. Terms used herein are defined based on functions in the present invention and may vary according to users, operator intentions, or usual practices. Therefore, the definition of the terms should be made based on the content throughout the specification.

Generally, the present invention provides a reduced memory for storing extrinsic information used as priori information during turbo decoding. Accordingly, the present invention provides a scheme for performing a transform operation for reducing the number of bits of extrinsic information output from the turbo decoder, storing the results, restoring extrinsic information stored in the memory to the original number of bits before using it as priori information for turbo decoding, and outputting the results as a turbo code.

Although a description of a method and apparatus according to the present invention will be made herein with reference to duo-binary turbo codes for an encoder having 2 input values, the present invention is also applicable to non-binary turbo codes.

In addition, the present invention can be applied to all methods that store extrinsic information used for the next decoding in the memory, as they use iterative decoding. That is, the present invention can be applied even to a Low Density Parity Check (LDPC) Code and a Turbo Product Code.

Figure 5:
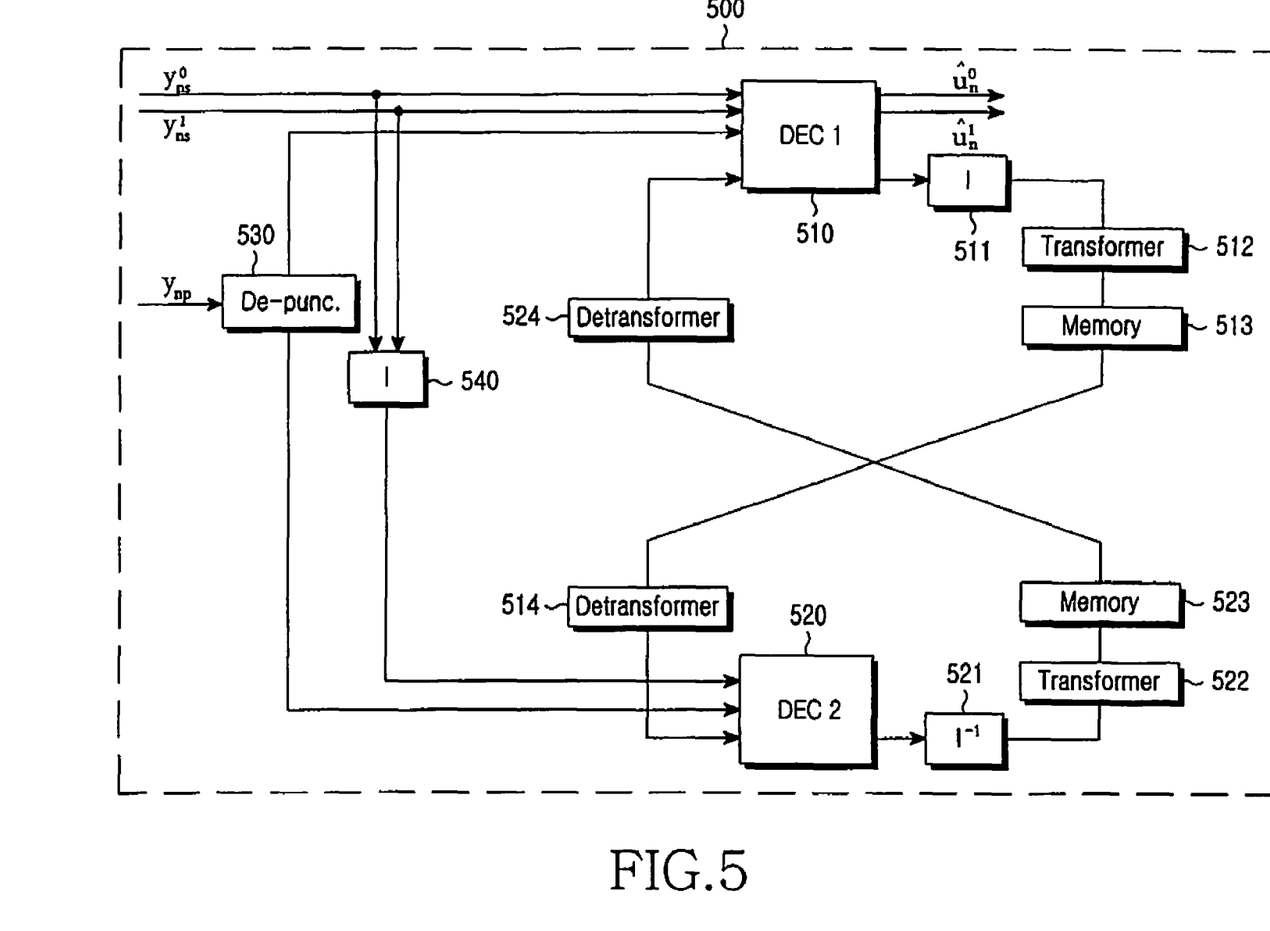
FIG. 5 is a block diagram illustrating a decoding apparatus according to an embodiment of the present invention.

FIG. 5 is a block diagram illustrating a decoding apparatus according to an embodiment of the present invention.

Referring to FIG. 5, a decoding apparatus 500 includes two decoders (DEC 1 and DEC2) 510 and 520, interleavers 511, 521, and 540, and a de-puncturer 530. The decoding apparatus 500 further includes transformers 512 and 522 for processing extrinsic information (extrinsic bits), or signals exchanged between input terminals and output terminals of the decoders 510 and 520, memories 513 and 523, and de-transformers 514 and 524.

When information bits $y_{ns}$ and parity bits $y_{np}$ are defined as signals that a codeword of a turbo coder has passed through a channel, $y_{ns}$ is a signal that information bits have passed through the channel, and $y_{np}$ is a signal that parity bits have passed through the channel. The decoders 510 and 520 each receive a received signal and extrinsic bits, perform decoding thereon, and output LLR $L_e$ for each bit. The transformers 512 and 522 perform a transform operation for reducing the number of bits of the $L_e$ output from the decoders 510 and 520, to a predetermined transfer bit width $W_{L_e}$. An example of this procedure will now be made below with reference to FIG. 6.

Figure 6:
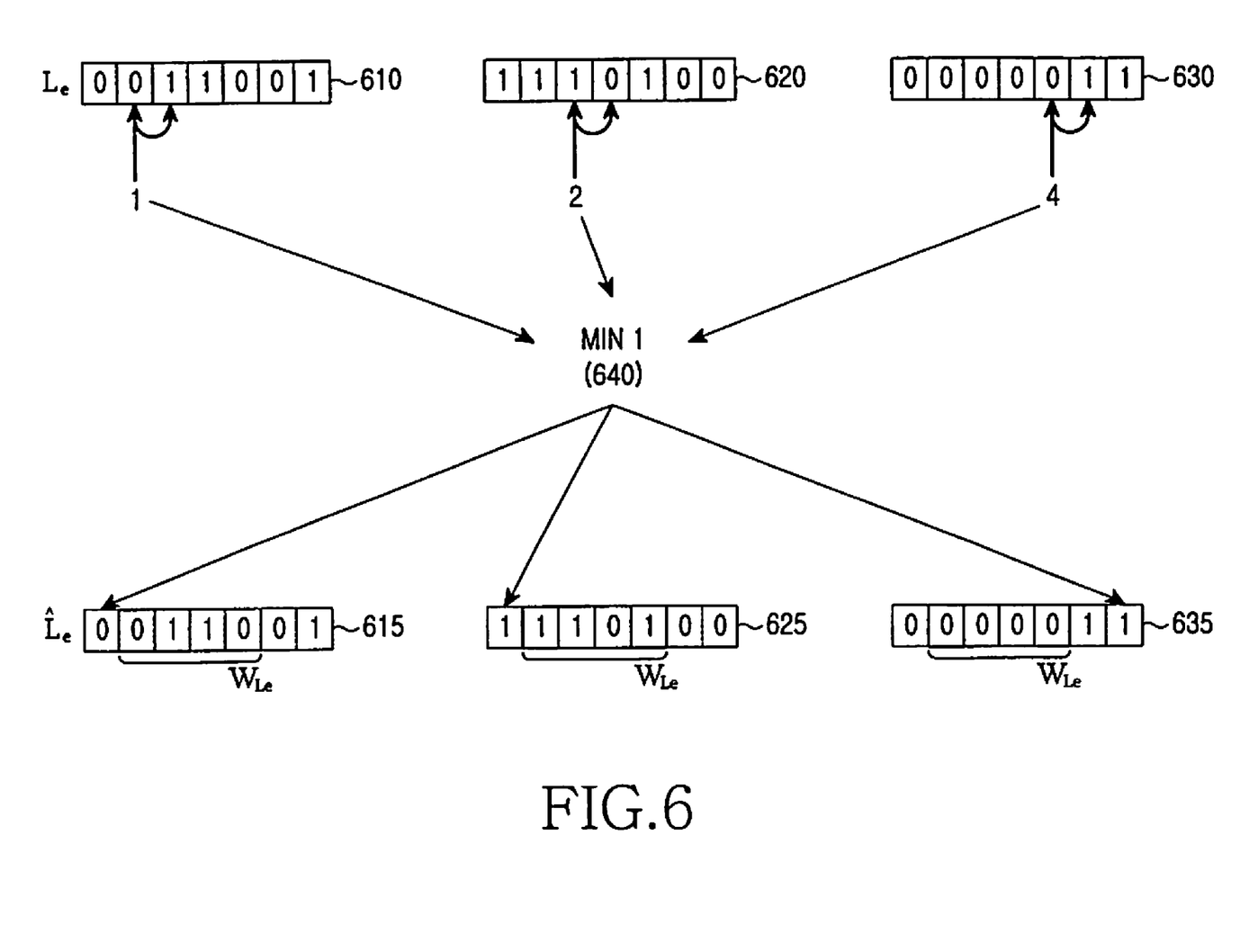
FIG. 6 is a diagram illustrating an exemplary operation of a transformer according to an embodiment of the present invention.

FIG. 6 is a diagram illustrating an exemplary operation of a transformer according to an embodiment of the present invention. More specifically, FIG. 6 illustrates an exemplary case in which a decoder outputs 3 $L_e$ values of 25, −12, and 3 with signed 7 bits, and sets a transfer bit width $W_{L_e}$ to 4 bits.

Referring to FIG. 6, if $L_e^A$ 610 of 25 is output as signed 7 bits of 0011001, $L_e^B$ 620 of −12 are output as signed 7 bits of 1110100, and $L_e^C$ 630 of 4 are output as signed 7 bits of 0000011 the last bit position SI, where a sign bit is repeated, is found from each $L_e$. That is, in FIG. 6, $SI^A=1$, $SI^B=2$, $SI^C=4$.

Thereafter, the minimum value $SI_{min}$ among the SIs is selected. In FIG. 6, because a value of $SI^A$ is 1 (640), which is the minimum value, $SI_{min}=1$. Further, because the transfer bit width $W_{L_e}$ is set to 4 bits, the transformers 512 and 522 should reduce the 7-bit $L_e^A$, $L_e^B$, and $L_e^C$ to 4-bit values. However, because $SI_{min}$ is set to 1, the transformers 512 and 522, extract 4 bits beginning from the position $SI_{min}$, and generate transferred extrinsic information $\hat{L}_e$. Accordingly, as illustrated in FIG. 6, $\hat{L}_e$ becomes 0110 (615), 1101 (625), and 0000 (635) of 4 bits.

The transformers 512 and 522 store the detected transferred extrinsic information of all 12 bits and the $SI_{min}$ in the memories 513 and 523.

Herein, the number of bits assigned to the $SI_{min}$ is determined by the number of bits of the $W_{L_e}$, and an example thereof is shown in Table 2 below.

TABLE 2

| Bit width per each extrinsic info ($W_{L_e}$) | Bit width of $SI_{min}$ ($W_{SI}$) | Total bit width for $L_e$ |
|---|---|---|
| 2 | 3 | 9 |
| 3 | 3 | 12 |
| 4 | 2 | 14 |
| 5 | 2 | 17 |
| 6 | 1 | 19 |
| 7 | 0 | 21 |

In the example illustrated in FIG. 6, because $W_{L_e}$ is set to 4, the $SI_{min}$ is determined with 2 bits with reference to Table 2.

The de-transformers 514 and 524 de-transform the $W_{L_e}$-bit extrinsic information stored in the memories 513 and 523, to the original number of bits of $L_e$, and input the results as priori information of the decoders 510 and 520.

Figure 7:
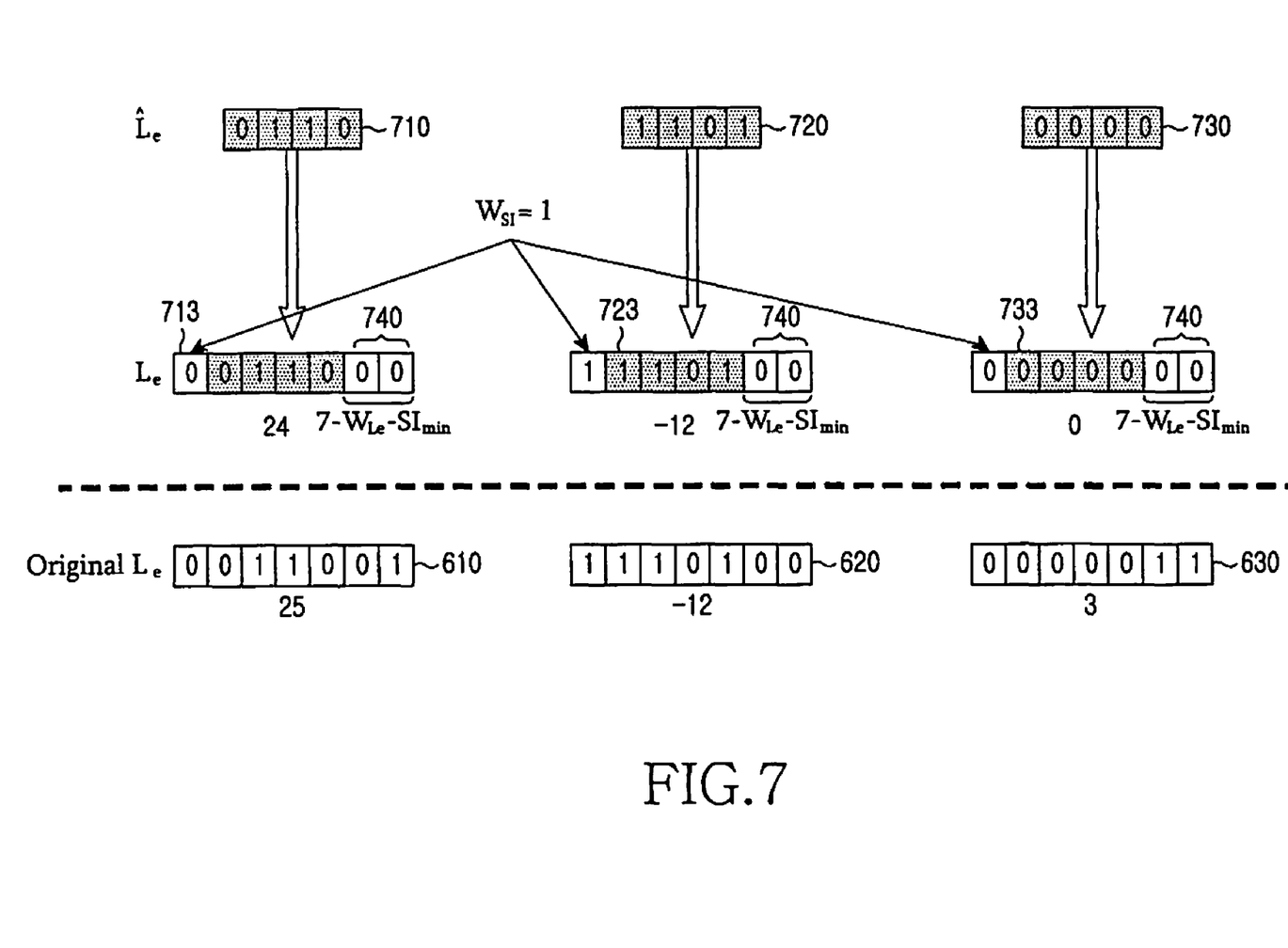
FIG. 7 is a diagram illustrating an exemplary operation of a de-transformer according to an embodiment of the present invention.

FIG. 7 is a diagram illustrating an exemplary operation of a de-transformer according to an embodiment of the present invention. More specifically, FIG. 7 illustrates a case in which $\hat{L}_e$, generated as illustrated in FIG. 6, by the transformer, is de-transformed into $L_e$ of signed 7 bits. Similarly, it is assumed in FIG. 7 that a transfer bit width $W_{L_e}$ is set to 4 bits.

The de-transformers 514 and 524 left-shift (740) $\hat{L}_e$ stored in the memories 513 and 523, i.e., 0110 (710), 1101 (720), and 0000 (730) of 4 bits by the number of bits calculated by Equation (1).

left shifted bit=number of bits of $L_e - W_{L_e} - SI_{min}$    (1)

In the example illustrated in FIG. 7, because the number of bits of $L_e$ is 7, and $W_{L_e}$ is 4 bits, $SI_{min}$ is 1 bit, the number of left-shifted bits is 2 bits. Therefore, in FIG. 7, $\hat{L}_e$ is left-shifted (740) by 2 bits.

Thereafter, the de-transformers 514 and 524 perform sign extension to the Most Significant Bit (MSB) by $SI_{min}$, depending on the $SI_{min}$ stored in the memories 513 and 523. In the example illustrated in FIG. 7, because $SI_{min}$ is 1, sign extension to the MSB is performed by 1 bit.

Accordingly, the de-transformers 514 and 524 de-transform the $\hat{L}_e$ values 710, 720, and 730 of 4 bits to $L_e^A$ 713, $L_e^B$ 723, and $L_e^C$ 733 of 7 bits.

It can be noted that the de-transformed $L_e^A$ 713, $L_e^B$ 723, and $L_e^C$ 733 can be de-transformed to their approximate values, though they are not perfectly de-transformed to the original $L_e^A$ 610, $L_e^B$ 620, and $L_e^C$ 630.

Figure 8A:
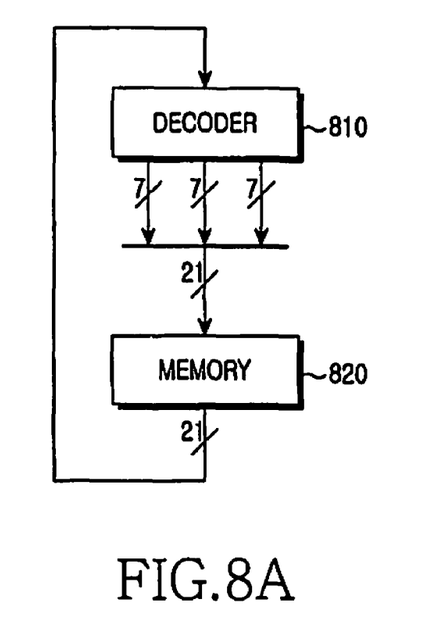
FIGS. 8A and 8B are diagrams comparing a conventional decoding apparatus to a decoding apparatus proposed by an embodiment of the present invention.
Figure 8B:
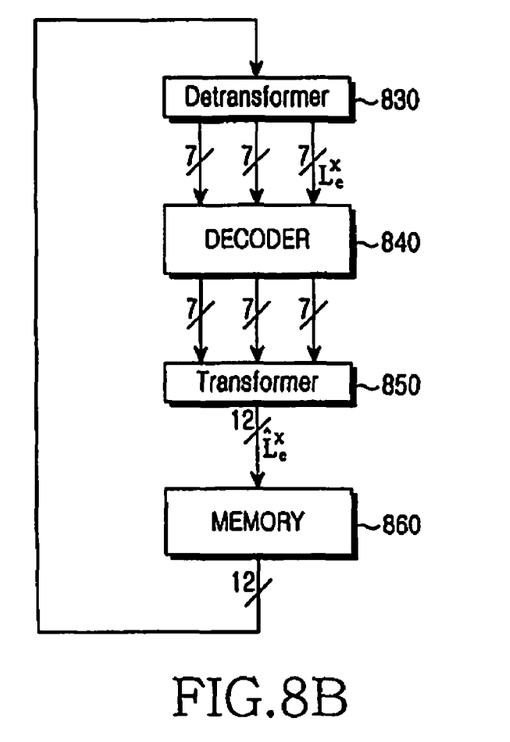

FIGS. 8A and 8B are diagrams comparing a conventional decoding apparatus to a decoding apparatus proposed by an embodiment of the present invention. Although one decoder is provided in FIGS. 8A and 8B, unlike in FIG. 5, by way of example, in order to reduce the hardware size, the one decoder can perform the operations of two or more decoders, and its operation result is equal to that of FIG. 5.

Referring to FIG. 8A, the conventional decoder 810, when it uses 7 bits as extrinsic information, stores a total of 21 bits in a memory 820 because three extrinsic information values are output.

However, referring to FIG. 8B, in accordance with an embodiment of the present invention, a transformer 850 and a de-transformer 830 are added between a decoder 840 and a memory 860. When $W_{L_e}$ is set to 3 bits, $W_{SI}$ becomes 3 bits in accordance with Table 2. The transformer 850 transforms the 7-bit $L_e$ values output from the decoder 840 into 3-bit extrinsic information, adds 9 bits of the transformed three 3-bit extrinsic information values to 3 bits corresponding to $SI_{min}$, and stores information of a total of 12 bits in the memory 860. The de-transformer 830 detects the information stored in the memory 860, de-transforms it to 7-bit extrinsic information, and inputs it to the decoder 840 as priori information.

As described above, conventionally, there was a need for a memory for storing three 7-bit extrinsic information values, i.e., a total of 21 bits. However, in accordance with the present invention, for $(W_{L_e}, W_{SI})=(3,3)$, $3*W_{L_e}+W_{SI}$ requires a memory for storing only 12 bits. Therefore, the present invention can reduce the required memory size by 43%.

Figure 9:
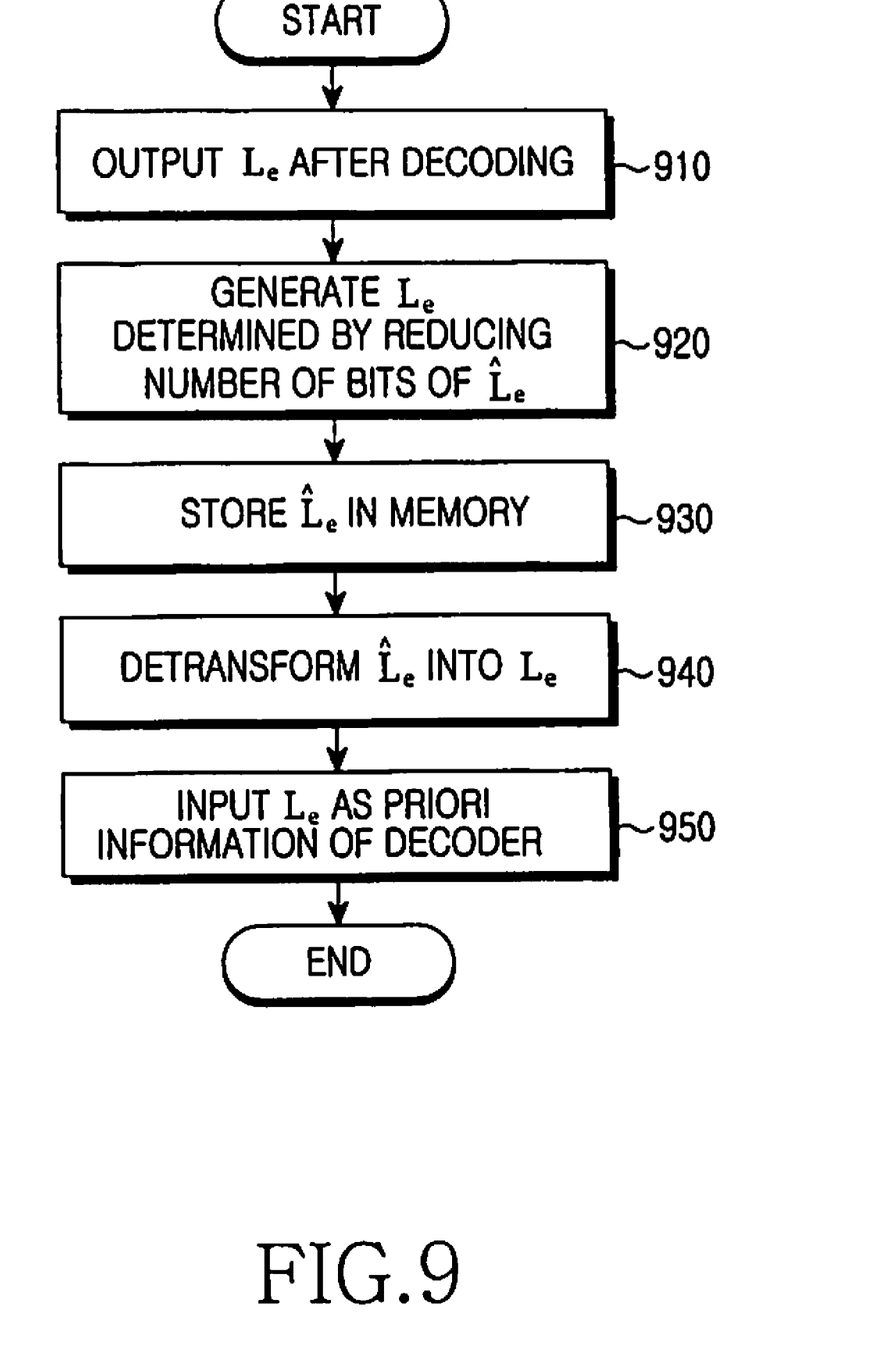
FIG. 9 is a flowchart illustrating a decoding method according to an embodiment of the present invention.

FIG. 9 is a flowchart illustrating a decoding method according to an embodiment of the present invention. Referring to FIG. 9, in step 910, a decoding apparatus receives a signal and extrinsic bits, performs decoding on the signal and the extrinsic bits, and generates an LLR $L_e$ for each bit. In step 920, the decoding apparatus performs a transform operation for generating $\hat{L}_e$. More specifically, the decoding apparatus reduces the number of bits of the LLR $L_e$ output from the decoder to a predetermined transfer bit width $W_{L_e}$. In step 930, the transformed value $\hat{L}_e$ is stored in the memory.

In step 940, the decoding apparatus de-transforms $\hat{L}_e$ stored in the memory as bits of $W_{L_e}$, to $L_e$ having the original number of bits. Thereafter, in step 950, the decoding apparatus inputs the de-transformed $L_e$ as priori information of the next decoding process.

Figure 10:
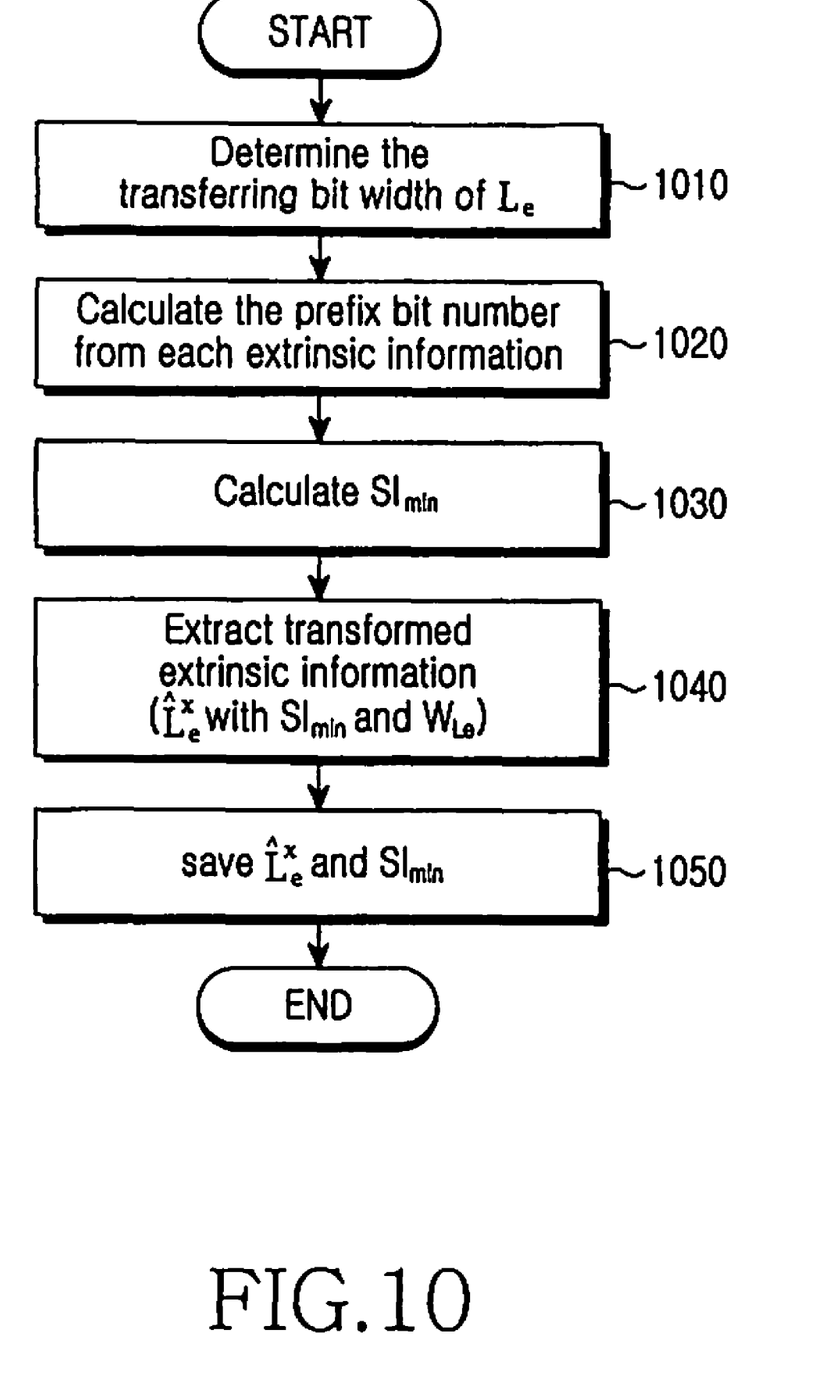
FIG. 10 is a flowchart illustrating a subroutine of the transforming process as illustrated in FIG. 9.

FIG. 10 is a flowchart illustrating a subroutine of the transforming process as illustrated in FIG. 9. More specifically, FIG. 10 illustrates a more detailed description of the transforming process of step 920.

Referring to FIG. 10, in step 1010, the transformer determines a transfer bit width of $L_e$. In step 1020, the transformer calculates the last bit positions Sis, where the MSB bit, or sign bit, is repeated, for each extrinsic information. In step 1030, the transformer selects the minimum value $SI_{min}$ from among the SIs. In step 1040, the transformer extracts extrinsic information corresponding to a transfer bit width of $L_e$ beginning from the position spaced apart by $SI_{min}$ from the MSB bit of each extrinsic information, and generates transferred extrinsic information $\hat{L}_e$. In step 1050, the transformer stores the generated $\hat{L}_e$ and $SI_{min}$ in a memory.

The de-transformers 514 and 524 de-transform the $W_{L_e}$-bit extrinsic information stored in the memories 513 and 523, to the original number of bits, and input the results as priori information of the decoders.

Figure 11:
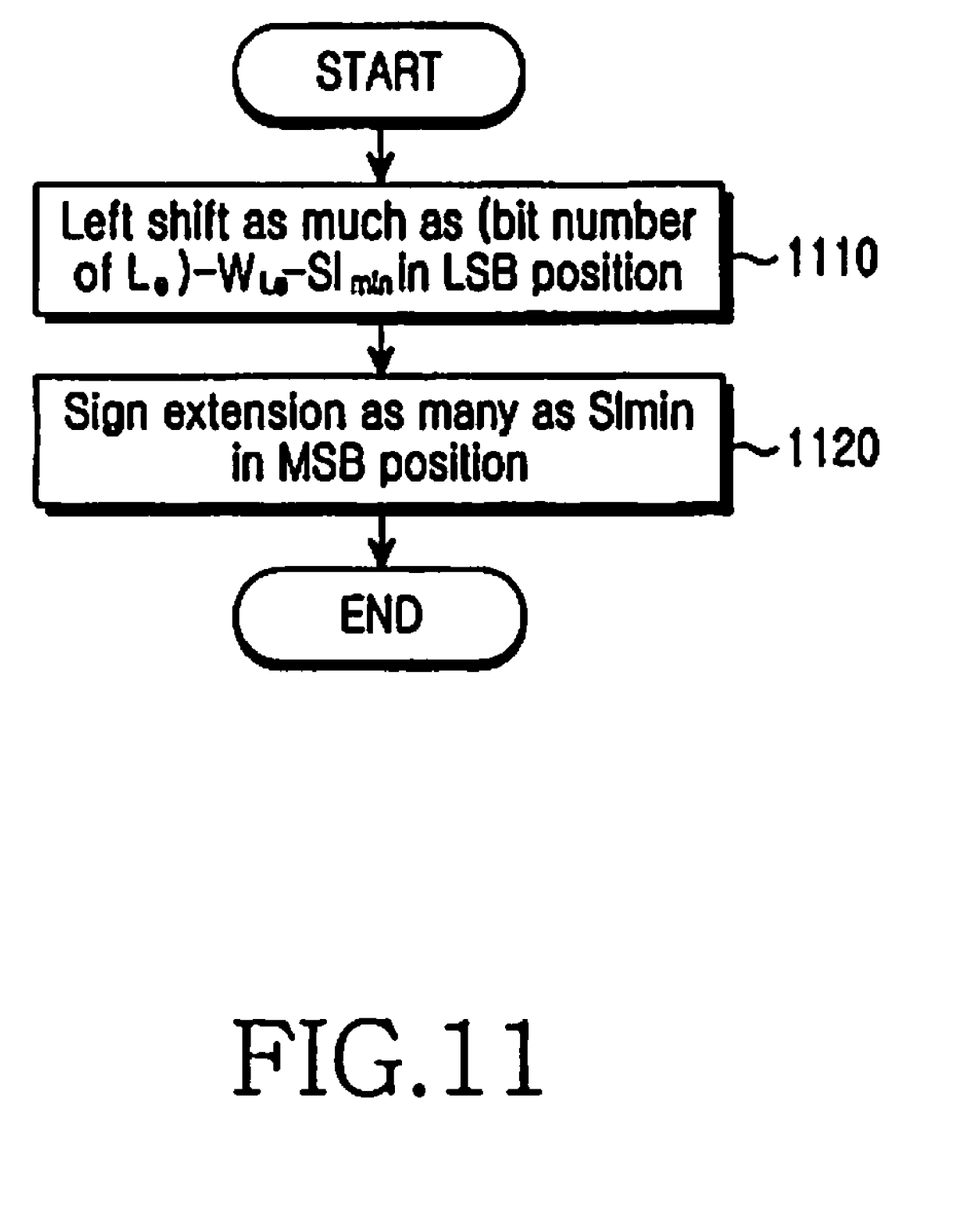
FIG. 11 is a flowchart illustrating a subroutine of the de-transforming process as illustrated in FIG. 9.

FIG. 11 is a flowchart illustrating a subroutine of the de-transforming process as illustrated in FIG. 9. More specifically, FIG. 11 illustrates a detailed description of the de-transforming process of step 940.

Referring to FIG. 11, in step 1110, the de-transformer left-shifts the $\hat{L}_e$ stored in the memory by the number of bit(s) calculated by Equation (1), beginning from the Least Significant Bit (LSB).

$$\text{left shifted bit} = \text{number of bits of } L_e - W_{L_e} - SI_{min} \quad (1)$$

Thereafter, in step 1120, the de-transformer performs sign extension to the MSB by $SI_{min}$, depending on the $SI_{min}$ stored in the memory.

As is apparent from the foregoing description, in order to reduce a storage memory for extrinsic information, which is necessary for turbo decoding, the present invention reduces the number of bits of the extrinsic information required during storage, thereby making it possible to reduce the extrinsic information storage memory without preventing a decrease in performance of other operations, as compared with the conventional method. Consequently, the present invention reduces a total area of a turbo decoder.

Accordingly, the present invention improves the area and power consumption, which are key issues during actual chip implementation for turbo codes, in making a chip for Non-Binary Turbo Codes.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A turbo decoding apparatus for performing iterative decoding on a received signal, the apparatus comprising:
    a decoder for receiving a signal and an $(N-1)^{th}$ decoding result, performing $N^{th}$ decoding on the received signal and the $(N-1)^{th}$ decoding result, and outputting first extrinsic information;
    a transformer for reducing a bit width of the first extrinsic information output from the decoder, and outputting second extrinsic information;
    a memory for storing the second extrinsic information output from the transformer; and
    a de-transformer for de-transforming the second extrinsic information stored in the memory, to third extrinsic information having a same bit width as the first extrinsic information, and inputting the third extrinsic information to the decoder.

2. The turbo decoding apparatus of claim 1, wherein the transformer determines a bit width of the second extrinsic information, selects a minimum value ($SI_{min}$) from among last bit positions in which a same value as a Most Significant Bit (MSB) of the first extrinsic information is repeated, generates the second extrinsic information by extracting each of the first extrinsic information by the determined bit width of the second extrinsic information, beginning from a bit position of the selected minimum value, and stores the generated second extrinsic information and the selected minimum value in the memory.

3. The turbo decoding apparatus of claim 2, wherein the selected minimum value is stored in the memory as a bit width ($W_{SI}$) determined according to the bit width $W_{L_e}$ of the second extrinsic information by:

| Bit width per each extrinsic info ($W_{L_e}$) | Bit width of $SI_{min}$ ($W_{SI}$) | Total bit width for extrinsic info |
|---|---|---|
| 2 | 3 | 9 |
| 3 | 3 | 12 |
| 4 | 2 | 14 |
| 5 | 2 | 17 |
| 6 | 1 | 19 |
| 7 | 0 | 21. |

4. The turbo decoding apparatus of claim 2, wherein the de-transformer left-shifts, beginning from a Least Significant Bit (LSB), the second extrinsic information stored in the memory by a bit calculated by:

$$\text{left shifted bit} = \text{(number of bits of the first extrinsic information)} - \text{(number of bits of the second extrinsic information)} - \text{the minimum value } SI_{min},$$

and
    performs sign extension to the MSB by the selected minimum value $SI_{min}$.

5. A turbo decoding method for performing iterative decoding on a received signal, the method comprising:
    receiving a signal and an $(N-1)^{th}$ decoding result;
    performing $N^{th}$ decoding on the received signal and the $(N-1)^{th}$ decoding result;
    generating first extrinsic information;
    transforming the first extrinsic information into second extrinsic information by reducing a bit width of the first extrinsic information;
    storing the second extrinsic information; and
    de-transforming the stored second extrinsic information into third extrinsic information having a same bit width as the first extrinsic information.

6. The turbo decoding method of claim 5, wherein transforming comprises:
    determining a bit width of the second extrinsic information;
    calculating last bit positions in which a same value as a Most Significant Bit (MSB) of the first extrinsic information is repeated,
    selecting a minimum value ($SI_{min}$) from among last bit positions;
    generating the second extrinsic information by extracting the first extrinsic information by the determined bit width of the second extrinsic information, beginning from a bit position of the selected minimum value; and
    storing the generated second extrinsic information and the selected minimum value.

7. The turbo decoding method of claim 6, wherein the minimum value is stored as a bit width ($W_{SI}$) determined according to the bit width ($W_{L_e}$) of the second extrinsic information by:

| Bit width per each extrinsic info ($W_{L_e}$) | Bit width of $SI_{min}$ ($W_{SI}$) | Total bit width for extrinsic info |
|---|---|---|
| 2 | 3 | 9 |
| 3 | 3 | 12 |
| 4 | 2 | 14 |
| 5 | 2 | 17 |
| 6 | 1 | 19 |
| 7 | 0 | 21. |

8. The turbo decoding method of claim 6, wherein de-transforming comprises:
left-shifting, beginning from a Least Significant Bit (LSB), the stored second extrinsic information by a bit calculated by:

left shifted bit=(number of bits of the first extrinsic information)−(number of bits of the second extrinsic information)−the selected minimum value $SI_{min}$;

performing sign extension to the MSB by the selected minimum value $SI_{min}$; and
restoring the second extrinsic information to the third extrinsic information.

* * * * *